(12) United States Patent
Nagawaram et al.

(10) Patent No.: US 11,946,983 B2
(45) Date of Patent: Apr. 2, 2024

(54) CURRENT TRANSFORMER WITH TEST WIRE

(71) Applicant: ABB Schweiz AG, Baden (CH)

(72) Inventors: Chandrashekar Nagawaram, Hyderabad (IN); Cecil Rivers, Jr., West Hartford, CT (US)

(73) Assignee: ABB Schweiz AG, Baden (CH)

( * ) Notice: Subject to any disclaimer, the term of this patent is extended or adjusted under 35 U.S.C. 154(b) by 27 days.

(21) Appl. No.: 17/471,787

(22) Filed: Sep. 10, 2021

(65) Prior Publication Data

US 2023/0077845 A1   Mar. 16, 2023

(51) Int. Cl.
| | |
|---|---|
| G01R 31/62 | (2020.01) |
| G01R 35/02 | (2006.01) |
| H01F 27/02 | (2006.01) |
| H01F 30/16 | (2006.01) |
| H01F 38/30 | (2006.01) |

(52) U.S. Cl.
CPC ............. *G01R 31/62* (2020.01); *G01R 35/02* (2013.01); *H01F 27/027* (2013.01); *H01F 30/16* (2013.01); *H01F 38/30* (2013.01)

(58) Field of Classification Search
CPC ....... G01R 31/62; G01R 35/02; H01F 27/027; H01F 30/16; H01F 38/30
USPC .......................................................... 324/674
See application file for complete search history.

(56) References Cited

U.S. PATENT DOCUMENTS

| 2010/0237972 A1* | 9/2010 | Yen .......................... H01F 27/06 336/92 |
| 2018/0366265 A1* | 12/2018 | Jang ........................ H01F 27/36 |

FOREIGN PATENT DOCUMENTS

| CN | 212301673 U | * | 1/2021 | ............. G01R 19/00 |
| DE | 102016225879 A1 | * | 6/2018 | ............. H01F 27/02 |

* cited by examiner

*Primary Examiner* — Jermele M Hollington
*Assistant Examiner* — Courtney G McDonnough
(74) *Attorney, Agent, or Firm* — Leydig, Voit & Mayer, Ltd.

(57) ABSTRACT

A current transformer includes a housing including generally cylindrical outer and inner walls defining an internal chamber, a front face enclosing one end of the internal chamber, a base, and a central opening defined by the inner wall. A generally toroidal current transformer core is disposed within the internal chamber. A secondary wiring is disposed about the transformer core and is configured to generate a current in response to magnetic flux in the transformer core. A pin housing is disposed on the front face of the housing adjacent the base. The pin housing has electrically conductive pins. A test wire passes through the central opening. The secondary wiring is electrically connected to a first pair of the pins and the test wire is electrically connected to a second pair of the pins.

20 Claims, 5 Drawing Sheets

CURRENT TRANSFORMER WITH TEST WIRE

BACKGROUND

The present invention relates to ground fault detection circuits and more particularly, to differential current transformers of a ground fault detection circuit.

Ground Fault Circuit Interrupt (GFCI) devices are often found used in receptacles in kitchens, bathrooms, and outdoor settings where there may be water or moisture that can pose a risk of electrocution. GFCI devices interrupt power in AC power systems when ground current faults and grounded neutral faults are detected. GFCI devices are also used in circuit breakers that protect these same areas of residential buildings. GFCI devices and other devices that detect ground faults and interrupt AC power systems may also be referred to generally as "ground fault detectors." Ground fault detectors typically have test circuits that can detect if the ground fault detection circuit is operating correctly.

GFCIs typically detect current leak age by comparing the current flowing in the line and returning in the neutral. A difference in current levels can indicate that a ground fault exists. GFCIs typically use a differential transformer, which will also be referred to as a current transformer herein, to detect a difference in the current level.

Many GFCI devices have a "test" button for verifying the operating status of a current transformer. Testing the device may involve the creation of a small imbalance by passing a test signal current through the differential transformer's opening via a test wire. The differential transformer and detection circuitry in a properly functioning device detects the test current as an imbalance and causes the circuit to trip. This means that the circuit breaker device is working. If the circuit breaker does not trip, the circuit may have a problem that indicates further evaluation of what caused the failure, and suggest some form of remediation.

Currently, assembly of a current transformer for a GFCI device requires that the test wire is manually inserted through the opening of the current transformer and conductive material at the bare ends of the wire is soldered onto a printed circuit board (PCB). Such soldering of a test wire typically requires one or more steps in addition to the mounting and wiring of other components forming the GFCI circuitry on the PCB. Retaining the test wire in position during the placement and soldering of the test wire may require the use of fixtures, careful manual placement, and time to inspect and ensure that the wires do not become disconnected or improperly positioned or interfere with the placement or operation of other components during manufacture or installment.

There is a need for current transformers that simplify assembly to a PCB and provides reliable operation. Devices according to the present disclosure satisfy the need.

BRIEF SUMMARY

In one embodiment, the disclosure includes a current transformer that includes a housing with generally cylindrical outer and inner walls defining an internal chamber, a front face enclosing one end of the internal chamber, a base, and a central opening defined by the inner wall. A generally toroidal current transformer core is disposed within the internal chamber. A secondary wiring is disposed about the transformer core and is configured to generate a current in response to an imbalance of magnetic flux in the transformer core. A pin housing is disposed on the front face of the housing adjacent the base. The pin housing has electrically conductive pins. A test wire passes through the central opening. The secondary wiring is electrically connected to a first pair of the pins and the test wire is electrically connected to a second pair of the pins.

These and other features will be apparent from the following detailed description and accompanying drawings.

DETAILED DESCRIPTION

Figure 7:
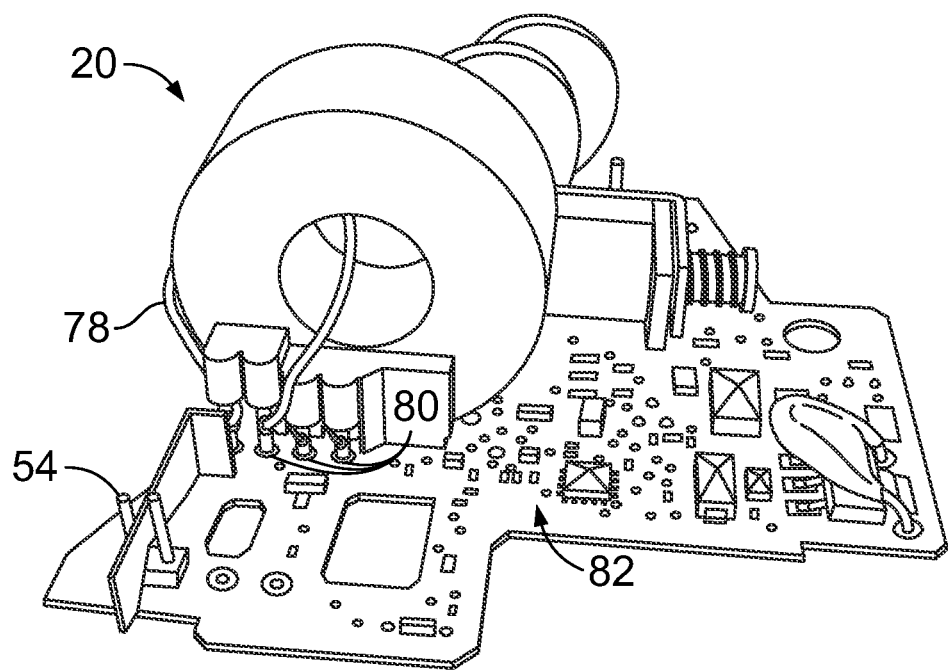
FIG. 7 is a perspective view of a current transformer according to the disclosure mounted on a printed circuit board.

Now referring generally to the figures where, whenever possible, like reference numbers will refer to like elements, there is illustrated in FIGS. 1-7 an exemplary current transformer 20 (see FIG. 7). The current transformer 20 includes a housing 22. A core shield 24 is disposed within the housing 22. A generally circular, toroidal core 26 comprising a wound secondary 27, which will also be referred to a secondary winding, is disposed within the core shield 24. A top washer 28 provides a rear cover and fits to and closes the housing 22 with the core shield 24 and core 26 positioned within the housing.

Figure 1:
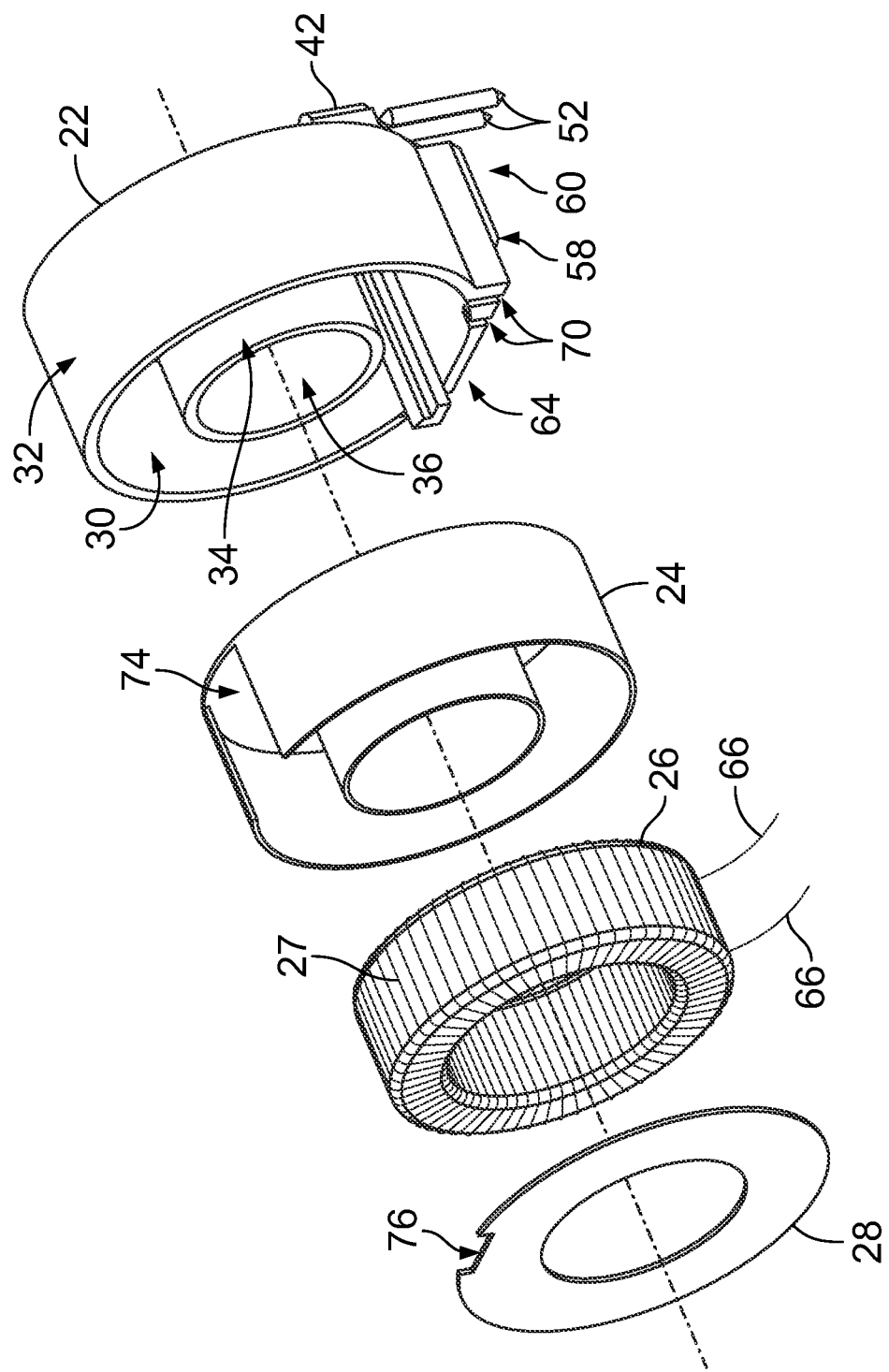
FIG. 1 is an exploded view of part of a current transformer according to the disclosure.
Figure 2:
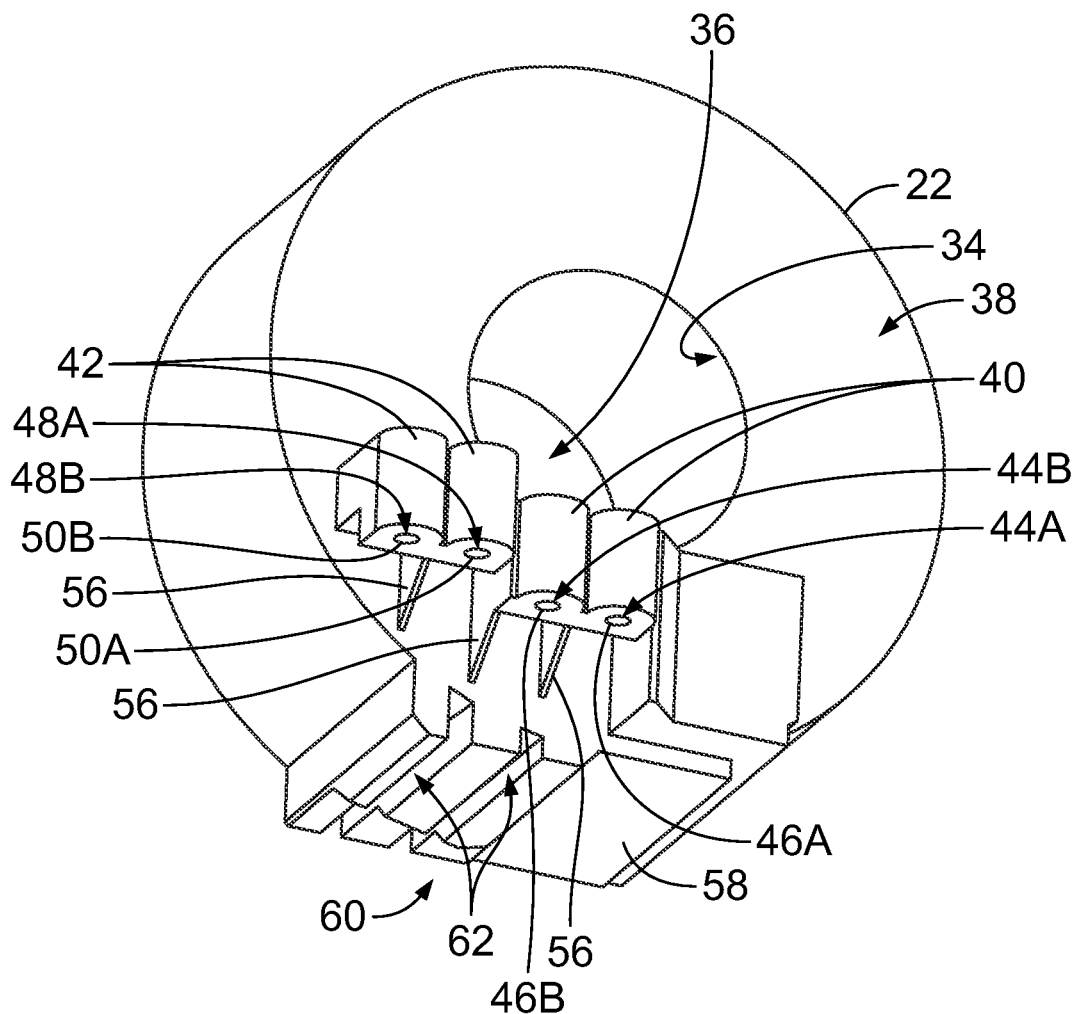
FIG. 2 is a perspective, front, side, and bottom view of a housing for a current transformer.
Figure 3:
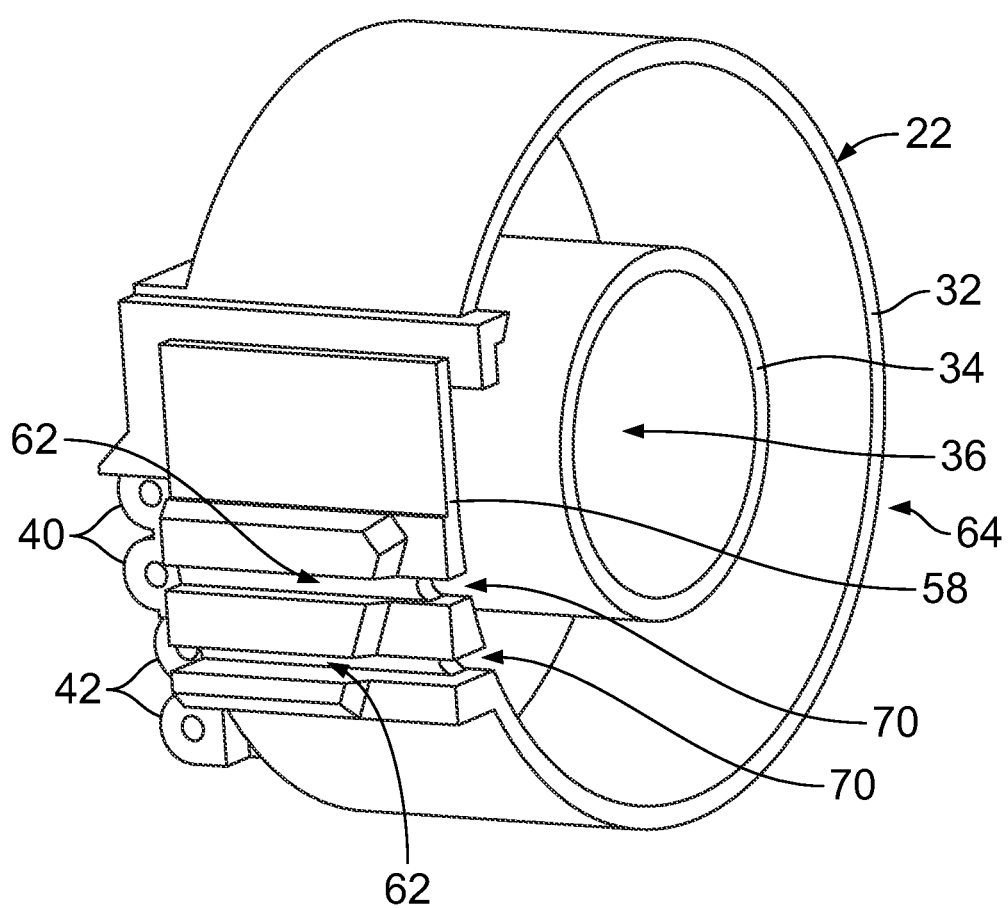
FIG. 3 is a perspective rear and bottom view of a housing for a current transformer.
Figure 4:
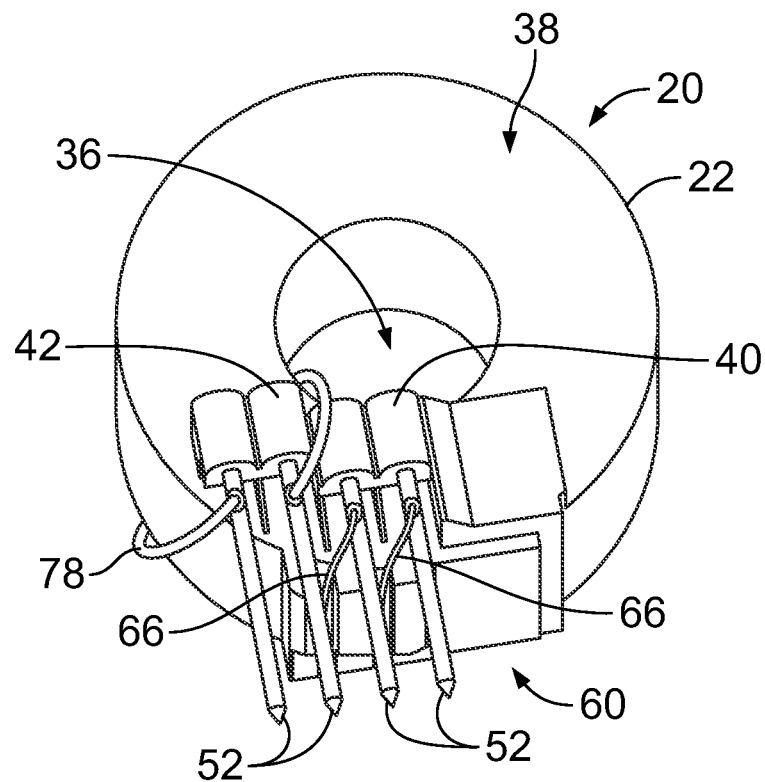
FIG. 4 is a front view of a current transformer according to the disclosure.
Figure 5:
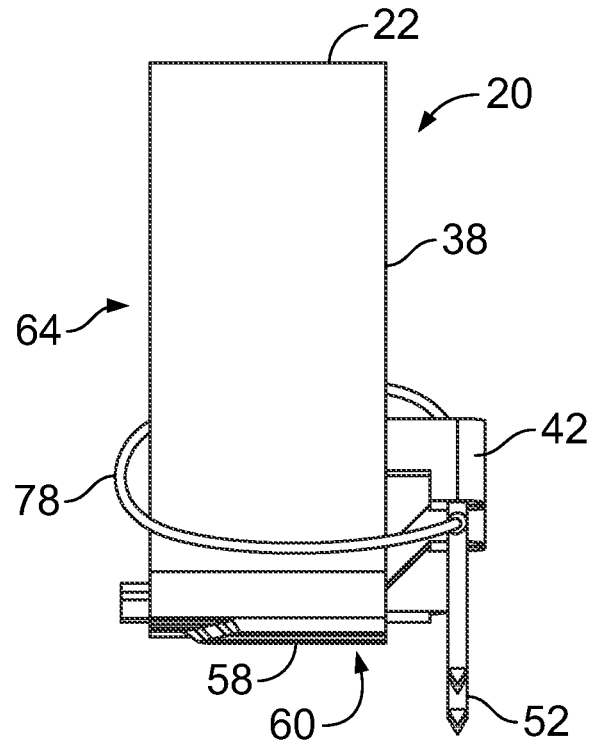
FIG. 5 is a side view of a current transformer according to the disclosure.
Figure 6:
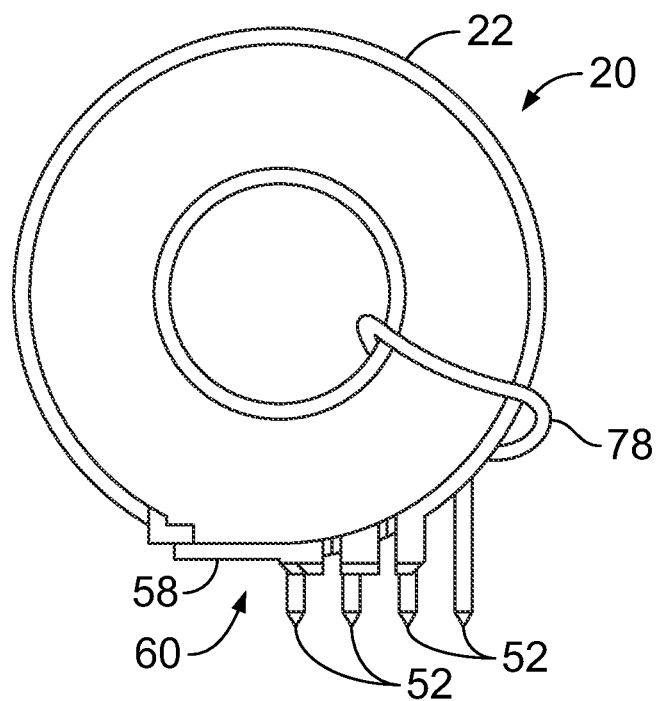
FIG. 6 is a rear view of a current transformer according to the disclosure.

Referring, in particular, to FIGS. 2 and 3, the housing 22 may be made of plastic or hard rubber or any suitable material. The housing 22 has an internal chamber 30 that is generally circular or toroidal in shape defined by an annular outer wall 32 and an annular inner wall 34. The inner wall 34 defines a central opening 36. The housing 22 has a front face 38 that defines one side of the internal chamber 30.

Formed on the front face 38 of the housing 22 is a secondary pin housing 40 and a test pin housing 42. The secondary pin housing 40 and the test pin housing 42 may be positioned side by side on the front face. The secondary pin housing 40 and the test pin housing 42 may be formed of the same material as the housing 22, such as plastic or hard rubber and formed as separate parts or as a one-piece construction with the housing.

The secondary pin housing 40 includes a block of material formed on the front face 38 with two bores 44A, 44B formed therethrough. The bores 44A, 44B may be parallel, and formed as blind holes or through bores. Each of the bores 44A, 44B may optionally include a respective conductive insert 46A, 46B in the form of a sleeve. Each of the conductive inserts 46A, 46B may be co-molded, press fit, or otherwise fixed within one of the bores 44A, 44B.

The test pin housing 42 includes a block of material formed on the front face 38 with two bores 48A, 48B formed therethrough. Each of the bores 48A, 48B may include a respective conductive insert 50A, 50B in the form of a sleeve. The bores 48A, 48B may be parallel, and formed as blind holes or through bores. Each of the conductive inserts 50A, 50B may be co-molded, press fit, or otherwise fixed within one of the bores 48A, 48B.

The pin housings 40, 42 are arranged on the front face 38 of the housing 22. Because the front face 38 of the housing 22 is annular, and the pin housings 40, 42 require a sufficient amount of material to house the pins 52, the pin housings may be staggered on the front face to provide maximum attachment contact. In other words, the secondary pin housing 40 may be attached to the front face 38 nearest a base portion 58 of the housing, whereas assuming that the base portion 58 is located at a lower part of the housing 22, the secondary pin housing is located at the lowest part of the front face. The test pin housing 42 may therefore be located upwardly and aside the secondary pin housing 40.

In embodiments, each of the bores 44A, 44B, 48A, and 48B may have an electrically conductive pin 52 fitted into a respective conductive insert 46A, 46B, 50A, and 50B to make an electrically conductive assembly. The inserts and pins are formed of any suitable electrically conductive material, such as aluminum or copper. The inserts and pins may be soldered together after assembly to form an integral, electrically conductive part. It may be preferred that the pins 52 are inserted into the bores 44A, 44B, 48A, 48B without inserts to produce a more simple construction.

While the test pin housing 42 is offset in the described manner, the bores 46A/B and 48A/B may still be aligned. However, in this embodiment, the pins 52 disposed in the test pin housing 42 will necessarily be longer in length than the pins 52 disposed in the secondary pin housing 40 so as to terminate at the same position.

The pins 52 are shaped and sized to be received into a suitably shaped and sized electrical receptacle or socket 80 located on a printed circuit board (PCB) 54 (see FIG. 7). In one embodiment the pins 52 are solid and cylindrical with a beveled or cone-shaped terminus for easy location of the pins in a PCB socket (not shown). In particular, the pins 52 are positioned so as to electrically attach to the PCB in one single step or attachment operation.

Circuitry on the PCB, which is placed in communication with a current transformer 20 according to the present disclosure when the transformer is installed, may include any suitable circuitry configured for testing Ground Fault Circuit Interrupt (GCFI) devices. Because the circuitry can be any suitable, well-known configuration, the details of such circuitry will not be set out herein. Many such GFCI devices have a "test" button for verifying the health of a device. Actuation of the test button creates a small imbalance by passing a stimulus signal current through the core opening of the transformer. For example, pressing the test button may cause a 120 volt AC power supply to be drawn across a resistor along a test wire that passes through the transformer. In one illustrative example, a current of 8 mA (milliamperes rms), which is greater than a 6 mA leakage current detection requirement for GFCI circuits, passes through the current transformer. The transformer and detection circuitry on the PCB in a properly functioning device would detect the test current as an imbalance and trip the circuit.

The pin housings 40, 42, have buttress material 56 attached to the housing 22 and extending to the housings to reinforce the pin housings so as to reduce flexing of the pin housings during manufacture, insertion of the inserts and pins, and during the subsequent attachment of the current transformer 20 to the PCB 54, which reduces the possibility of breakage of the housings and electrical connections.

The housing 22 has a base portion 58 formed on the outer wall 32 of the housing in a position that defines the bottom 60 of the current transformer 20. The bottom 60 of the base portion 58 is shaped to engage a correspondingly shaped part of the PCB 54 and provide stability to the current transformer. The base portion 58 includes a pair of grooves 62 that extend from the front face 38 to a rear side 64 of the housing. The pair of grooves 62 terminate at the front face 38 at a position that at or aligned with the two parallel bores 44A, 44B of the secondary pin housing 40. Each of the pair of grooves 62 is sized and shaped to contain and protect one of the pair of wires 66 from the core 26 and permit the wires to pass between the current transformer 20 and the PCB 54 to pins 52 disposed in the secondary pin housing 40.

Since the wires 66 originate from the core 26, which is positioned within the housing 22, there are a pair of notches 70 formed on the rear side 64 of the outer wall 32 to permit the wires 66 to pass from the internal chamber 30, extend along and within the grooves 62, and terminate at respective pins 52, where they are electrically connected, via soldering for example, to the pins, so as to electrically connect the windings 27 of the secondary to circuitry on the PCB 54 when the assembled transformer 20 is installed onto the PCB to form a GFCI device.

While the base 58 or bottom 60 may be planar with a correspondingly shaped portion of the PCB 54 to receive the transformer 20, there may also be features that provide guidance or assistance in proper location of the transformer on the PCB. For example, referring in particular to FIG. 3, the base 60 may be configured as two adjoined planar sections comprising a flat land portion 84 and a raised portion 86 that extends from the flat land portion. Where portions 84, 86 meet, there may be a step or stop portion 88 that transitions from the elevations of the land and raised portions. The step or stop portion 88 may be a surface normal to the land portion 84 or beveled at an angle that is not 90 degrees. In addition, the stop portion 88 may lie in a plane parallel to that of the front face 38 or angled with respect to the front face. The step 88 and shape of the raised portion 86 permit a positive engagement with a corresponding feature (not shown) formed on the PCB 54 for proper location of the transformer 20 on the PCB.

Returning to FIG. 1, the core 26 is enclosed within a core shield 24 as is well known. After the core 26 and core shield 24 assembled and positioned within the internal chamber 30 of the housing 22, a top washer 28 is attached to outer and inner wall 32, 34 on the side of the housing opposite the front face 38 to fully enclose the core. The top washer 28 may be a flat, circular plate with a washer opening 72 that aligns with the central opening 36 such that primary leads may be passed through the transformer 20 as is well known.

Both the core shield 24 and the top washer 28 include openings for wires 66 forming the ends of the wound secondary 27 can extend from the internal chamber 30 to the outside of the transformer 20. The core shield 24 may have a window 74 that is aligned during assembly with a notch 76 formed on the top washer 28 for that purpose.

A test wire 78 passes through the central opening 36 and around the outside of the toroid or the exterior of the housing 22. Each conductive end of the test wire 78 is electrically connected, via soldering for example, to respective pins 52 of bores 48A, 48B of the test pin housing 42. When assembled and the test wire 78 and wires from the wound secondary 66 are connected to pins 52 correctly, the transformer 20 is connected to the PCB 54 via the four pins 52 by insertion of the pins into the PCB 54. After mounting of all of the electrical components onto the PCB 54, the components and transformer 20 may be wired to the PCB in a single step via conventional methods.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

The invention claimed is:

1. A current transformer, comprising:
    a housing comprising generally cylindrical outer and inner walls defining a generally annular internal chamber between a first side of the inner wall and the outer wall and a generally cylindrical central opening defined by a second side of the inner wall;
    a generally toroidal current transformer core disposed within the internal chamber;
    a secondary wiring disposed about the transformer core configured to generate a current in response to magnetic flux in the transformer core;
    a pin housing disposed on the housing, the pin housing comprising electrically conductive pins; and
    a test wire that passes through the central opening and outside the internal chamber;
    wherein the secondary wiring is electrically connected to a first pair of the pins and the test wire is electrically connected to a second pair of the pins.

2. The current transformer of claim 1 wherein the pin housing includes a plurality of bores, each of the bores including a pin.

3. The current transformer of claim 2 wherein each of the plurality of bores is a blind hole.

4. The current transformer of claim 1 wherein the housing includes a front face enclosing one end of the internal chamber and wherein the pin housing is disposed on the front face.

5. The current transformer of claim 4 wherein the pin housing includes a secondary pin housing comprising a pair of bores, each of the pair of bores including one of the first pair of pins.

6. The current transformer of claim 5 wherein the housing includes a base configured to connect to a printed circuit board, wherein the base is formed adjacent the pin housing.

7. The current transformer of claim 6 wherein the base includes a pair of grooves sized and shaped to receive wires of the secondary wiring.

8. The current transformer of claim 7 wherein the housing comprises a pair of notches formed in the outer wall adjacent the pair of grooves, the wires of the secondary wiring passing from the internal chamber via the pair of notches to the pair of grooves and to the first pair of pins of the secondary pin housing and wherein each of the wires are connected to a respective one of the first pair of pins.

9. The current transformer of claim 5 wherein the pin housing includes a test pin housing comprising a pair of bores, each of the pair of bores including one of the second pair of pins.

10. The current transformer of claim 9 wherein the pin housing and the secondary pin housing are formed as a one-piece construction with the front face.

11. The current transformer of claim 10 wherein ends of the test wire are electrically connected to respective ones of the second pair of pins.

12. The current transformer of claim 4 further comprising a core shield configured to surround at least some of the current transformer core.

13. The current transformer of claim 12 wherein the core shield includes a window formed therethrough for passage therethrough of wires of the secondary winding.

14. The current transformer of claim 13 further comprising a top washer configured to enclose the other side of the internal chamber.

15. The current transformer of claim 14 wherein the top washer includes a notch adjacent the window of the core shield for passage therethrough of wires of the secondary winding.

16. The current transformer of claim 4 comprising buttress material connecting the pin housing with the front face.

17. A ground fault circuit interrupt (GCFI) device, comprising:
    a printed circuit board comprising circuitry configured to detect ground faults and circuitry configured to test the ground fault circuitry; and
    a current transformer disposed on the printed circuit board, the current transformer comprising:
        a housing comprising generally cylindrical outer and inner walls defining a generally annular internal chamber between a first side of the inner wall and the outer wall and a generally cylindrical central opening defined by a second side of the inner wall;
        a generally toroidal current transformer core disposed within the internal chamber;
        a secondary wiring disposed about the transformer core configured to generate a current in response to magnetic flux in the transformer core;
        a pin housing disposed on the housing adjacent the base, the pin housing comprising electrically conductive pins; and
        a test wire that passes through the central opening and outside the internal chamber;
        wherein the secondary wiring is electrically connected to a first pair of the pins and the test wire is electrically connected to a second pair of the pins.

18. The current transformer of claim 17 wherein the pin housing includes a secondary pin housing comprising a first pair of bores, each of the first pair of bores including one of the pins.

19. The current transformer of claim 18 wherein the pin housing includes a test pin housing comprising a second pair of bores, each of the second pair of bores including one of the pins.

20. The current transformer of claim 19 wherein the pin housing and the secondary pin housing are formed as a one-piece construction with a front face of the housing.

* * * * *